US012568766B2

(12) United States Patent

Haga

(10) Patent No.: US 12,568,766 B2
(45) Date of Patent: Mar. 3, 2026

(54) POLYMER-BASED PIEZOELECTRIC COMPOSITE MATERIAL FILM

(71) Applicant: FUJIFILM Corporation, Tokyo (JP)

(72) Inventor: Masayuki Haga, Minamiashigara (JP)

(73) Assignee: FUJIFILM Corporation, Tokyo (JP)

( * ) Notice: Subject to any disclaimer, the term of this patent is extended or adjusted under 35 U.S.C. 154(b) by 903 days.

(21) Appl. No.: 17/863,703

(22) Filed: Jul. 13, 2022

(65) Prior Publication Data

US 2022/0344573 A1      Oct. 27, 2022

Related U.S. Application Data

(63) Continuation of application No. PCT/JP2020/045374, filed on Dec. 7, 2020.

(30) Foreign Application Priority Data

Jan. 16, 2020     (JP) ................................. 2020-004898

(51) Int. Cl.
*H04N 17/00*          (2006.01)
*H10N 30/092*        (2023.01)
(Continued)

(52) U.S. Cl.
CPC ......... *H10N 30/852* (2023.02); *H10N 30/092* (2023.02); *H04R 17/005* (2013.01)

(58) Field of Classification Search
CPC ............. G10H 3/143; G10H 2220/535; G10H 2220/555; H04R 17/005; H04R 31/00;
(Continued)

(56) References Cited

U.S. PATENT DOCUMENTS

2009/0324954 A1    12/2009  Nakajima
2016/0020380 A1     1/2016  Miyoshi
(Continued)

FOREIGN PATENT DOCUMENTS

JP          58-15400 A       1/1983
JP        2010-30875 A       2/2010
(Continued)

OTHER PUBLICATIONS

Korean Office Action for Korean Application No. 10-2022-7023113, dated Feb. 13, 2025, with an English translation.
(Continued)

*Primary Examiner* — Levi Gannon
(74) *Attorney, Agent, or Firm* — Birch, Stewart, Kolasch & Birch, LLP

(57)          ABSTRACT

Provided is a polymer-based piezoelectric composite material film which has high conversion efficiency and is capable of reproducing a sound with a sufficient volume. The polymer-based piezoelectric composite material film is a film including a polymer-based piezoelectric composite material which contains piezoelectric particles in a matrix containing a polymer material, and two electrode layers which are laminated on both surfaces of the polymer-based piezoelectric composite material, in which a coefficient of variation of intensity ratio $\alpha_1$ of (002) plane peak intensity and (200) plane peak intensity derived from the piezoelectric particles=(002) plane peak intensity/((002) plane peak intensity+(200) plane peak intensity) in a case where the polymer-based piezoelectric composite material is evaluated by an X-ray diffraction method is less than 0.3.

4 Claims, 2 Drawing Sheets

(51) Int. Cl.
  *H10N 30/85* (2023.01)
  *H04R 17/00* (2006.01)
(58) Field of Classification Search
  CPC ............ H04R 31/003; H04R 2307/023; H04R
      2307/025; H04R 2499/15; H10N 30/04;
      H10N 30/05; H10N 30/06; H10N 30/092;
      H10N 30/20; H10N 30/85; H10N 30/852
  See application file for complete search history.

(56) References Cited

U.S. PATENT DOCUMENTS

2017/0291419 A1* 10/2017 Mizukami ............ B41J 2/14209
2018/0160248 A1   6/2018 Murakami et al.

FOREIGN PATENT DOCUMENTS

| | | |
|---|---|---|
| JP | 2014-199888 A | 10/2014 |
| JP | 6431984 B2 | 11/2018 |
| WO | WO 2017/018313 A1 | 2/2017 |

OTHER PUBLICATIONS

International Preliminary Report on Patentability, dated Jul. 28, 2022, and Written Opinion of the International Searching Authority, dated Feb. 16, 2021, for International Application No. PCT/JP2020/045374, with an English translation.
International Search Report for International Application No. PCT/JP2020/045374, dated Feb. 16, 2021, with an English translation.
Dalle Vacche et al., "Effect of interfacial interactions on the electromechanical response of poly(vinylidene fluoride-trifluoroethylene)/BaTIO3 composites and its time dependence after poling," Composites Science and Technology, vol. 114, 2015, pp. 103-109.
Extended European Search Report for European Application No. 20913657.1, dated Aug. 11, 2023.
Kumar Sappati et al., "Flexible Piezoelectric 0-3 PZT-PDMS Thin Film for Tactile Sensing," IEEE Sensors Journal, vol. 20, No. 9, 2020, pp. 4610-4617.
Korean Office Action for corresponding Korean Application No. 10-2022-7023113, dated May 29, 2025, with English translation.
Japanese Notice of Reasons for Refusal for Japanese Application No. 2021-570676, dated May 9, 2023, with an English translation.
Korean Office Action for Korean Application No. 10-2022-7023113, dated Jul. 24, 2024, with an English translation.

* cited by examiner

POLYMER-BASED PIEZOELECTRIC COMPOSITE MATERIAL FILM

CROSS-REFERENCE TO RELATED APPLICATIONS

This application is a Continuation of PCT International Application No. PCT/JP2020/045374 filed on Dec. 7, 2020, which claims priority under 35 U.S.C. § 119(a) to Japanese Patent Application No. 2020-004898 filed on Jan. 16, 2020. The above application is hereby expressly incorporated by reference, in its entirety, into the present application.

BACKGROUND OF THE INVENTION

1. Field of the Invention

The present invention relates to a polymer-based piezoelectric composite material film used for an acoustic device such as a speaker.

2. Description of the Related Art

With reduction in thickness and weight of displays such as liquid crystal displays or organic electroluminescence (EL) displays, speakers used in these thin displays are also required to be lighter and thinner. Further, with the development of flexible displays formed of flexible substrates such as plastics, speakers used in the flexible displays are also required to be flexible.

Examples of typical shapes of speakers of the related art include a funnel-like so-called cone shape and a spherical dome shape. However, in a case where such a speaker is intended to be incorporated in the above-described thin display, there is a concern that the lightness and the flexibility of the speaker are impaired because the speaker cannot be sufficiently made thin. Further, in a case where the speaker is attached externally, it is troublesome to carry the speaker.

Therefore, as a speaker that is thin and can be integrated into a thin display and/or a flexible display without impairing lightness and/or flexibility, a sheet-like piezoelectric film having flexibility and a property of stretching and contracting in response to an applied voltage has been suggested.

For example, the applicant suggested an electroacoustic piezoelectric film disclosed in WO2017/018313A as a sheet-like piezoelectric film that has flexibility and can stably reproduce a high-quality sound. The electroacoustic piezoelectric film disclosed in WO2017/018313A includes a polymer-based piezoelectric composite material (piezoelectric layer) obtained by dispersing piezoelectric particles in a viscoelastic matrix consisting of a polymer material having a viscoelasticity at room temperature, an electrode layer formed on each of both surfaces of the polymer-based piezoelectric composite material, and a protective layer formed on a surface of the electrode layer.

In such a polymer-based piezoelectric composite material film, a ferroelectric material such as lead zirconate titanate (PZT) is used as the piezoelectric particles. The crystal structure of the ferroelectric material is divided into a plurality of domains in which directions of spontaneous polarization are different from each other. In this state, since the spontaneous polarization of each domain and the piezoelectric effect produced by the spontaneous polarization cancel each other out, the piezoelectricity is not seen in the entire structure.

Therefore, the directions of spontaneous polarization of each domain are arranged (aligned) by performing an electric polarization treatment such as corona poling and applying an electric field of a certain value or greater from the outside. The piezoelectric particles subjected to the electrical polarization treatment exhibit a piezoelectric effect in response to the electric field from the outside.

Since the piezoelectric layer of the polymer-based piezoelectric composite material film contains such piezoelectric particles having piezoelectricity, the piezoelectric film stretches and contracts in the plane direction and vibrates in a direction perpendicular to the plane in response to the applied voltage so that the vibration (sound) is converted to an electric signal.

Here, the X-ray diffraction method (XRD) has been used as a method of analyzing a crystal structure, and XRD is used to investigate how the atoms are arranged inside a crystal.

WO2017/018313A describes that the sound pressure of the polymer-based piezoelectric composite material film is further improved by setting an intensity ratio to 0.6 or greater and less than 1 using "intensity ratio of (002) plane peak intensity and (200) plane peak intensity derived from piezoelectric particles=(002) plane peak intensity/((002) plane peak intensity+(200) plane peak intensity)" as an index of aligning properties in a case where the polymer-based piezoelectric composite material is evaluated by the X-ray diffraction method.

SUMMARY OF THE INVENTION

In such a polymer-based piezoelectric composite material film, it is required to increase the conversion efficiency in order to obtain a higher sound pressure.

An object of the present invention is to solve such a problem of the related art and to provide a polymer-based piezoelectric composite material film which has high conversion efficiency and is capable of reproducing a sound with a sufficient volume.

In order to solve the above-described problem, the present invention has the following configurations.

(1) A polymer-based piezoelectric composite material film comprising: a polymer-based piezoelectric composite material which contains piezoelectric particles in a matrix containing a polymer material; and two electrode layers which are laminated on both surfaces of the polymer-based piezoelectric composite material, in which a coefficient of variation of intensity ratio $\alpha_1$ of (002) plane peak intensity and (200) plane peak intensity derived from the piezoelectric particles=(002) plane peak intensity/((002) plane peak intensity+(200) plane peak intensity) in a case where the polymer-based piezoelectric composite material is evaluated by an X-ray diffraction method is less than 0.3.

(2) The polymer-based piezoelectric composite material film according to (1), in which the intensity ratio $\alpha_1$ is 0.6 or greater and less than 1.

(3) The polymer-based piezoelectric composite material film according to (1) or (2), in which an amplitude of wrinkles formed on the polymer-based piezoelectric composite material film is in a range of 1 μm to 20 μm.

(4) The polymer-based piezoelectric composite material film according to any one of (1) to (3), in which the polymer-based piezoelectric composite material film has a Young's modulus of 0.5 GPa to 3.5 GPa.

According to the present invention as described above, it is possible to provide a polymer-based piezoelectric composite material film which has high conversion efficiency and is capable of reproducing a sound with a sufficient volume.

DESCRIPTION OF THE PREFERRED EMBODIMENTS

Hereinafter, a polymer-based piezoelectric composite material film according to the embodiment of the present invention will be described in detail based on the preferred embodiments shown in the accompanying drawings.

Descriptions of the configuration requirements described below may be made based on representative embodiments of the present invention, but the present invention is not limited to such embodiments.

In the present specification, a numerical range shown using "to" indicates a range including numerical values described before and after "to" as a lower limit and an upper limit.

[Polymer-Based Piezoelectric Composite Material Film]

A polymer-based piezoelectric composite material film is a polymer-based piezoelectric composite material film including a polymer-based piezoelectric composite material which contains piezoelectric particles in a matrix containing a polymer material, and two electrode layers which are laminated on both surfaces of the polymer-based piezoelectric composite material, in which the coefficient of variation of "intensity ratio $\alpha_1$ of (002) plane peak intensity and (200) plane peak intensity derived from piezoelectric particles= (002) plane peak intensity/((002) plane peak intensity+(200) plane peak intensity)" in a case where the polymer-based piezoelectric composite material is evaluated by the X-ray diffraction method is less than 0.3.

Figure 1:
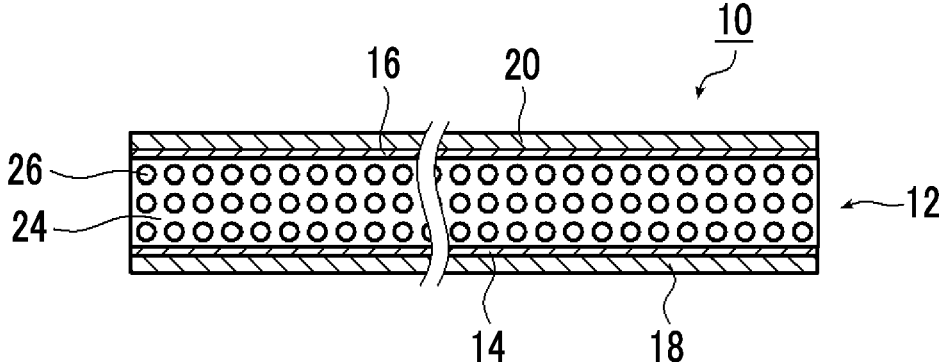
FIG. 1 is a cross-sectional view conceptually illustrating an example of a polymer-based piezoelectric composite material film according to the embodiment of the present invention.

FIG. 1 is a cross-sectional view conceptually illustrating an example of the polymer-based piezoelectric composite material film according to the embodiment of the present invention.

As illustrated in FIG. 1, the polymer-based piezoelectric composite material film (hereinafter, also referred to as a piezoelectric film) 10 according to the embodiment of the present invention includes a polymer-based piezoelectric composite material 12 containing piezoelectric particles 26 in a matrix 24 that contains a polymer material, a lower electrode 14 laminated on one surface of the polymer-based piezoelectric composite material 12, a lower protective layer 18 laminated on the lower electrode 14, an upper electrode 16 laminated on the other surface of the polymer-based piezoelectric composite material 12, and an upper protective layer 20 laminated on the upper electrode 16. The polymer-based piezoelectric composite material is a sheet-like material having piezoelectricity. Hereinafter, the polymer-based piezoelectric composite material is also referred to as a piezoelectric layer.

Here, in the piezoelectric film 10 according to the embodiment of the present invention, the coefficient of variation of "intensity ratio $\alpha_1$ of (002) plane peak intensity and (200) plane peak intensity derived from piezoelectric particles= (002) plane peak intensity/((002) plane peak intensity+(200) plane peak intensity)" in a case where the piezoelectric layer 12 consisting of the polymer-based piezoelectric composite material is evaluated by the X-ray diffraction method is less than 0.3.

Further, the intensity ratio $\alpha_1$ is preferably 0.6 or greater and less than 1.

The details thereof will be described below.

The piezoelectric layer 12 illustrated in FIG. 1 contains the piezoelectric particles 26 in the matrix 24 containing a polymer material. Further, the lower electrode 14 and the upper electrode 16 are electrode layers in the present invention. Further, the lower protective layer 18 and the upper protective layer 20 are protective layers in the present invention.

As will be described below, the piezoelectric film 10 (piezoelectric layer 12) is polarized in the thickness direction as a preferred embodiment.

[Piezoelectric Layer]

In the piezoelectric film 10, the piezoelectric layer 12 which is a polymer-based piezoelectric composite material consists of a polymer-based piezoelectric composite material obtained by uniformly dispersing the piezoelectric particles 26 in the matrix 24 consisting of a polymer material as conceptually illustrated in FIG. 1.

As the material of the matrix 24 (serving as a matrix and a binder) of the polymer-based piezoelectric composite material constituting the piezoelectric layer 12, a polymer material having viscoelasticity at room temperature is preferably used. Further, in the present specification, the "room temperature" indicates a temperature range of approximately 0° C. to 50° C.

Here, the piezoelectric film 10 according to the embodiment of the present invention is suitably used for a speaker having flexibility such as a speaker for a flexible display. Here, it is preferable that the polymer-based piezoelectric composite material (piezoelectric layer 12) used for a speaker having flexibility satisfies the following requirements. Therefore, it is preferable that a polymer material having viscoelasticity at room temperature is used as a material satisfying the following requirements.

(i) Flexibility

For example, in a case of being gripped in a state of being loosely bent like a document such as a newspaper or a magazine as a portable device, the piezoelectric film is continuously subjected to large bending deformation from the outside at a relatively slow vibration of less than or equal to a few Hz. In this case, in a case where the polymer-based piezoelectric composite material is hard, a large bending stress is generated to that extent, and a crack is generated at the interface between a matrix and piezoelectric particles, which may lead to breakage. Accordingly, the polymer-based piezoelectric composite material is required to have suitable flexibility. In addition, in a case where strain energy is diffused into the outside as heat, the stress is able to be relieved. Therefore, the polymer-based piezoelectric composite material is required to have a suitably large loss tangent.

(ii) Acoustic Quality

In a speaker, the piezoelectric particles vibrate at a frequency of an audio band of 20 Hz to 20 kHz, and the vibration energy causes the entire polymer-based piezoelectric composite material (piezoelectric layer) to vibrate integrally so that a sound is reproduced. Therefore, in order to increase the transmission efficiency of the vibration energy, the polymer-based piezoelectric composite material is required to have appropriate hardness. In addition, in a case where the frequencies of the speaker are smooth as the frequency characteristic thereof, an amount of change in acoustic quality in a case where the lowest resonance frequency is changed in association with a change in the curvature of the speaker decreases. Therefore, the loss tangent of the polymer-based piezoelectric composite material is required to be suitably large.

That is, the polymer-based piezoelectric composite material is required to exhibit a behavior of being rigid with respect to a vibration of 20 Hz to 20 kHz and being flexible with respect to a vibration of less than or equal to a few Hz. In addition, the loss tangent of a polymer-based piezoelectric composite material is required to be suitably large with respect to the vibration of all frequencies of 20 kHz or less.

In general, a polymer solid has a viscoelasticity relieving mechanism, and a molecular movement having a large scale is observed as a decrease (relief) in a storage elastic modulus (Young's modulus) or a maximal value (absorption) in a loss elastic modulus along with an increase in temperature or a decrease in frequency. Among them, the relief due to a microbrown movement of a molecular chain in an amorphous region is referred to as main dispersion, and an extremely large relieving phenomenon is observed. A temperature at which this main dispersion occurs is a glass transition point (Tg), and the viscoelasticity relieving mechanism is most remarkably observed.

In the polymer-based piezoelectric composite material (piezoelectric layer 12), the polymer-based piezoelectric composite material exhibiting a behavior of being rigid with respect to a vibration of 20 Hz to 20 kHz and being flexible with respect to a vibration of less than or equal to a few Hz is realized by using a polymer material whose glass transition point is room temperature, that is, a polymer material having a viscoelasticity at room temperature as a matrix. In particular, from the viewpoint that such a behavior is suitably exhibited, it is preferable that a polymer material in which the glass transition temperature at a frequency of 1 Hz is at room temperature, that is, in a range of 0° C. to 50° C. is used for a matrix of the polymer-based piezoelectric composite material.

As the polymer material having a viscoelasticity at room temperature, various known materials can be used as long as the materials have dielectric properties. It is preferable that a polymer material in which the maximal value of a loss tangent at a frequency of 1 Hz according to a dynamic viscoelasticity test at room temperature, that is, in a range of 0° C. to 50° C. is 0.5 or greater is used as the polymer material.

In this manner, in a case where the polymer-based piezoelectric composite material is slowly bent due to an external force, stress concentration on the interface between the matrix and the piezoelectric particles at the maximum bending moment portion is relieved, and thus satisfactory flexibility is obtained.

In the polymer material, it is preferable that a storage elastic modulus (E') at a frequency of 1 Hz according to the dynamic viscoelasticity measurement is 100 MPa or greater at 0° C. and 10 MPa or less at 50° C.

In this manner, the bending moment generated in a case where the polymer-based piezoelectric composite material is slowly bent due to the external force can be reduced, and the polymer-based piezoelectric composite material can exhibit a behavior of being rigid with respect to an acoustic vibration of 20 Hz to 20 kHz.

In addition, it is more suitable that the relative dielectric constant of the polymer material is 10 or greater at 25° C. Accordingly, in a case where a voltage is applied to the polymer-based piezoelectric composite material, a higher electric field is applied to the piezoelectric particles in the matrix, and thus a large deformation amount can be expected.

However, in consideration of ensuring satisfactory moisture resistance and the like, it is suitable that the relative dielectric constant of the polymer material is 10 or less at 25° C.

Examples of the polymer material satisfying such conditions include cyanoethylated polyvinyl alcohol (cyanoethylated PVA), polyvinyl acetate, polyvinylidene chloride-co-acrylonitrile, a polystyrene-vinyl polyisoprene block copolymer, polyvinyl methyl ketone, and polybutyl methacrylate. In addition, as these polymer materials, a commercially available product such as Hybrar 5127 (manufactured by Kuraray Co., Ltd.) can also be suitably used. Among these, it is preferable to use a material containing a cyanoethyl group and particularly preferable to use cyanoethylated PVA as the polymer material.

Further, these polymer materials may be used alone or in combination (mixture) of a plurality of kinds thereof.

In the matrix 24 for which such a polymer material is used, a plurality of polymer materials may be used in combination as necessary.

That is, for the purpose of adjusting dielectric properties, mechanical properties, and the like, other dielectric polymer materials may be added to the matrix 24 in addition to the polymer material having viscoelasticity at room temperature as necessary.

Examples of the dielectric polymer material that can be added thereto include a fluorine-based polymer such as polyvinylidene fluoride, a vinylidene fluoride-tetrafluoroethylene copolymer, a vinylidene fluoride-trifluoroethylene copolymer, a polyvinylidene fluoride-trifluoroethylene copolymer, or a polyvinylidene fluoride-tetrafluoroethylene copolymer, a polymer containing a cyano group or a cyanoethyl group such as a vinylidene cyanide-vinyl acetate copolymer, cyanoethyl cellulose, cyanoethyl hydroxysaccharose, cyanoethyl hydroxycellulose, cyanoethyl hydroxypullulan, cyanoethyl methacrylate, cyanoethyl acrylate, cyanoethyl hydroxyethyl cellulose, cyanoethyl amylose, cyanoethyl hydroxypropyl cellulose, cyanoethyl dihydroxypropyl cellulose, cyanoethyl hydroxypropyl amylose, cyanoethyl polyacrylamide, cyanoethyl polyacrylate, cyanoethyl pullulan, cyanoethyl polyhydroxymethylene, cyanoethyl glycidol pullulan, cyanoethyl saccharose, or cyanoethyl sorbitol, and synthetic rubber such as nitrile rubber or chloroprene rubber.

Among these, a polymer material containing a cyanoethyl group is suitably used.

Further, in the matrix 24 of the piezoelectric layer 12, the number of kinds of the dielectric polymer materials to be added in addition to the polymer material having viscoelasticity at room temperature such as cyanoethylated PVA is not limited to one, and a plurality of kinds of the materials may be added.

In addition, for the purpose of adjusting the glass transition point, a thermoplastic resin such as a vinyl chloride resin, polyethylene, polystyrene, a methacrylic resin, polybutene, or isobutylene, and a thermosetting resin such as a phenol resin, a urea resin, a melamine resin, an alkyd resin, or mica may be added to the matrix 24 in addition to the dielectric polymer materials.

Further, for the purpose of improving the pressure sensitive adhesiveness, a viscosity imparting agent such as rosin ester, rosin, terpene, terpene phenol, or a petroleum resin may be added.

In the matrix 24 of the piezoelectric layer 12, the addition amount in a case of adding materials other than the polymer material having viscoelasticity such as cyanoethylated PVA is not particularly limited, but is preferably set to 30% by mass or less in terms of the proportion of the materials in the matrix 24.

In this manner, the characteristics of the polymer material to be added can be exhibited without impairing the viscoelasticity relieving mechanism in the matrix 24, and thus preferable results, for example, an increase in the dielectric constant, improvement of the heat resistance, and improvement of the adhesiveness between the piezoelectric particles 26 and the electrode layer can be obtained.

The piezoelectric layer 12 is a polymer-based piezoelectric composite material which contains the piezoelectric particles 26 in the matrix 24.

The piezoelectric particles 26 consist of ceramic particles having a perovskite type or wurtzite type crystal structure.

Examples of the ceramic particles constituting the piezoelectric particles 26 include lead zirconate titanate (PZT), lead lanthanum zirconate titanate (PLZT), barium titanate ($BaTiO_3$), zinc oxide (ZnO), and a solid solution (BFBT) of barium titanate and bismuth ferrite ($BiFe_3$).

The piezoelectric particles 26 may be used alone or in combination (mixture) of a plurality of kinds thereof.

The particle diameter of such piezoelectric particles 26 is not limited, and may be appropriately selected depending on the size, the applications, and the like of the polymer-based piezoelectric composite material (piezoelectric film 10).

The particle diameter of the piezoelectric particles 26 is preferably in a range of 1 to 10 µm. By setting the particle diameter of the piezoelectric particles 26 to be in the above-described range, preferable results in terms of achieving both excellent piezoelectric characteristics and flexibility of the polymer-based piezoelectric composite material (piezoelectric film 10) can be obtained.

In FIG. 1, the piezoelectric particles 26 in the piezoelectric layer 12 are uniformly dispersed in the matrix 24 with regularity, but the present invention is not limited thereto.

That is, the piezoelectric particles 26 in the piezoelectric layer 12 may be irregularly dispersed in the matrix 24 as long as the piezoelectric particles 26 are preferably uniformly dispersed therein.

In the piezoelectric layer 12 (polymer-based piezoelectric composite material), the ratio between the amount of the matrix 24 and the amount of the piezoelectric particles 26 in the piezoelectric layer 12 is not limited, and the ratio thereof may be appropriately set according to the size and the thickness of the piezoelectric layer 12 in the plane direction, the applications of the polymer-based piezoelectric composite material, the characteristics required for the polymer-based piezoelectric composite material, and the like.

The volume fraction of the piezoelectric particles 26 in the piezoelectric layer 12 is preferably in a range of 30% to 80%, more preferably 50% or greater, and still more preferably in a range of 50% to 80%.

By setting the ratio between the amount of the matrix 24 and the amount of the piezoelectric particles 26 to be in the above-described range, preferable results in terms of achieving both of excellent piezoelectric characteristics and flexibility can be obtained.

The thickness of the piezoelectric layer 12 is not limited, and may be appropriately set according to the applications of the polymer-based piezoelectric composite material, the characteristics required for the polymer-based piezoelectric composite material, and the like. It is advantageous that the thickness of the piezoelectric layer 12 increases in terms of the rigidity such as the strength of stiffness of a so-called sheet-like material, but the voltage (potential difference) required to stretch and contract the piezoelectric layer 12 by the same amount increases.

The thickness of the piezoelectric layer 12 is preferably in a range of 10 to 300 µm, more preferably in a range of 20 to 200 µm, and still more preferably in a range of 30 to 150 µm.

By setting the thickness of the piezoelectric layer 12 to be in the above-described range, preferable results in terms of achieving both ensuring of the rigidity and moderate elasticity can be obtained.

[Electrode Layer and Protective Layer]

As illustrated in FIG. 1, the piezoelectric film 10 of the illustrated example has a configuration in which the lower electrode 14 is provided on one surface of the piezoelectric layer 12, the lower protective layer 28 is provided on the surface thereof, the upper electrode 16 is provided on the other surface of the piezoelectric layer 12, and the upper protective layer 30 is provided on the surface thereof. Here, the upper electrode 16 and the lower electrode 14 form an electrode pair.

That is, the piezoelectric film 10 has a configuration in which both surfaces of the piezoelectric layer 12 are sandwiched between the electrode pair, that is, the upper electrode 16 and the lower electrode 14 and the laminate is further sandwiched between the lower protective layer 28 and the upper protective layer 30.

As described above, in the piezoelectric film 10, the region sandwiched between the upper electrode 16 and the lower electrode 14 is stretched and contracted according to an applied voltage.

The lower protective layer 28 and the upper protective layer 30 have a function of coating the upper electrode 16 and the lower electrode 14 and applying moderate rigidity and mechanical strength to the piezoelectric layer 12. That is, the piezoelectric layer 12 consisting of the matrix 24 and the piezoelectric particles 26 in the piezoelectric film 10 exhibits extremely excellent flexibility under bending deformation at a slow vibration, but may have insufficient rigidity or mechanical strength depending on the applications. As a compensation for this, the piezoelectric film 10 is provided with the lower protective layer 28 and the upper protective layer 30.

The lower protective layer 28 and the upper protective layer 30 are not limited, and various sheet-like materials can be used, and suitable examples thereof include various resin films.

Among these, from the viewpoints of excellent mechanical properties and heat resistance, a resin film consisting of polyethylene terephthalate (PET), polypropylene (PP), polystyrene (PS), polycarbonate (PC), polyphenylene sulfide (PPS), polymethylmethacrylate (PMMA), polyetherimide (PEI), polyimide (PI), polyethylene naphthalate (PEN), triacetyl cellulose (TAC), and a cyclic olefin-based resin is suitably used.

The thickness of the lower protective layer 28 or the upper protective layer 30 is not limited. In addition, the thicknesses of the lower protective layer 28 and the upper protective layer 30 are basically the same as each other, but may be different from each other.

Here, in a case where the rigidity of the lower protective layer 28 and the upper protective layer 30 is extremely high, not only is the stretch and contraction of the piezoelectric layer 12 constrained, but also the flexibility is impaired. Therefore, it is advantageous that the thickness of the lower protective layer 28 and the thickness of the upper protective layer 30 decrease except for the case where the mechanical strength or excellent handleability as a sheet-like material is required.

The thickness of the lower protective layer 28 and the upper protective layer 30 is preferably in a range of 3 μm to 100 μm, more preferably in a range of 3 μm to 50 μm, still more preferably in a range of 3 μm to 30 μm, and particularly preferably in a range of 4 μm to 10 μm.

Here, in a case where the thickness of the lower protective layer 28 and the upper protective layer 30 in the piezoelectric film 10 is two times or less the thickness of the piezoelectric layer 12, preferable results in terms of achieving both ensuring of the rigidity and moderate elasticity can be obtained.

For example, in a case where the thickness of the piezoelectric layer 12 is 50 μm and the lower protective layer 28 and the upper protective layer 30 consist of PET, the thickness of each of the lower protective layer 28 and the upper protective layer 30 is preferably 100 μm or less, more preferably 50 μm or less, and still more preferably 25 μm or less.

In the piezoelectric film 10, the lower electrode 14 is formed between the piezoelectric layer 12 and the lower protective layer 28, and the upper electrode 16 is formed between the piezoelectric layer 12 and the upper protective layer 30.

The lower electrode 14 and the upper electrode 16 are provided to apply a driving voltage to the piezoelectric layer 12.

In the present invention, the material for forming the lower electrode 14 and the upper electrode 16 is not limited, and various conductors can be used as the material. Specific examples thereof include carbon, palladium, iron, tin, aluminum, nickel, platinum, gold, silver, copper, titanium, chromium, and molybdenum, alloys thereof, laminates and composites of these metals and alloys, and indium tin oxide. Among these, copper, aluminum, gold, silver, platinum, and indium tin oxide are suitably exemplified as the lower electrode 14 and the upper electrode 16.

In addition, the method of forming the lower electrode 14 and the upper electrode 16 is not limited, and various known methods such as a vapor-phase deposition method (a vacuum film forming method) such as vacuum vapor deposition or sputtering, film formation using plating, and a method of bonding a foil formed of the materials described above can be used.

Among these, particularly from the viewpoint of ensuring the flexibility of the piezoelectric film 10, a thin film made of copper, aluminum, or the like formed by vacuum vapor deposition is suitably used as the lower electrode 14 and the upper electrode 16. Among these, particularly a thin film made of copper formed by vacuum vapor deposition is suitably used.

The thickness of the lower electrode 14 and the upper electrode 16 is not limited. In addition, the thicknesses of the lower electrode 14 and the upper electrode 16 are basically the same as each other, but may be different from each other.

Here, similarly to the lower protective layer 28 and the upper protective layer 30 described above, in a case where the rigidity of the lower electrode 14 and the upper electrode 16 is extremely high, not only is the stretch and contraction of the piezoelectric layer 12 constrained, but also the flexibility is impaired. Therefore, it is advantageous that the thicknesses of lower electrode 14 and the upper electrode 16 decrease in a case where the electric resistance is not excessively high. That is, it is preferable that the lower electrode 14 and the upper electrode 16 are thin film electrodes.

The thickness of each of the lower electrode 14 and the upper electrode 16 is less than the thickness of the protective layer, and is preferably in a range of 0.05 μm to 10 μm, more preferably in a range of 0.05 μm to 5 μm, still more preferably in a range of 0.08 μm to 3 μm, and particularly preferably in a range of 0.1 μm to 2 μm.

Here, it is suitable that the product of the thicknesses of the lower electrode 14 and the upper electrode 16 and the Young's modulus of the piezoelectric film 10 is less than the product of the thicknesses of the lower protective layer 28 and the upper protective layer 30 and the Young's modulus because the flexibility is not considerably impaired.

For example, in a case of a combination consisting of the lower protective layer 28 and the upper protective layer 30 formed of PET (Young's modulus: approximately 6.2 GPa) and the lower electrode 14 and the upper electrode 16 consisting of copper (Young's modulus: approximately 130 GPa), the thickness of the lower electrode 14 and the upper electrode 16 is preferably 1.2 μm or less, more preferably 0.3 μm or less, and still more preferably 0.1 μm or less in a case of assuming that the thickness of the lower protective layer 28 and the upper protective layer 30 is 25 μm.

It is preferable that, in the piezoelectric film 10, the maximal value of the loss tangent (tan δ) at a frequency of 1 Hz according to dynamic viscoelasticity measurement is present at room temperature and more preferable that the maximal value at which the loss tangent is 0.1 or greater is present at room temperature.

In this manner, even in a case where the piezoelectric film 10 is subjected to large bending deformation at a relatively slow vibration of less than or equal to a few Hz from the outside, since the strain energy can be effectively diffused to the outside as heat, occurrence of cracks on the interface between the matrix and the piezoelectric particle can be prevented.

In the piezoelectric film 10, it is preferable that the storage elastic modulus (E') at a frequency of 1 Hz according to the dynamic viscoelasticity measurement is in a range of 10 GPa to 30 GPa at 0° C. and in a range of 1 GPa to 10 GPa at 50° C. The same applies to the conditions for the piezoelectric layer 12.

In this manner, the piezoelectric film 10 may have large frequency dispersion in the storage elastic modulus (E'). That is, the piezoelectric film 10 can exhibit a behavior of being rigid with respect to a vibration of 20 Hz to 20 kHz and being flexible with respect to a vibration of less than or equal to a few Hz.

In the piezoelectric film 10, it is preferable that the product of the thickness and the storage elastic modulus at a frequency of 1 Hz according to the dynamic viscoelasticity measurement is in a range of $1.0 \times 10^5$ to $2.0 \times 10^6$ (1.0E+05 to 2.0E+06) N/m at 0° C. and in a range of $1.0 \times 10^5$ to $1.0 \times 10^6$ (1.0E+05 to 1.0E+06) N/m at 50° C. The same applies to the conditions for the piezoelectric layer 12.

In this manner, the piezoelectric film 10 may have moderate rigidity and mechanical strength within a range not impairing the flexibility and the acoustic characteristics.

Further, in the piezoelectric film 10, it is preferable that the loss tangent at a frequency of 1 kHz at 25° C. is 0.05 or greater in a master curve obtained from the dynamic viscoelasticity measurement. The same applies to the conditions for the piezoelectric layer 12.

In this manner, the frequency of a speaker using the piezoelectric film 10 is smooth as the frequency characteristic thereof, and thus a change in acoustic quality in a case where the lowest resonance frequency $f_0$ is changed according to a change in the curvature of the speaker can be decreased.

In the present invention, the storage elastic modulus (Young's modulus) and the loss tangent of the piezoelectric film 10, the piezoelectric layer 12, and the like may be measured by a known method. As an example, the measurement may be performed using a dynamic viscoelasticity measuring device DMS6100 (manufactured by SII Nanotechnology Inc.).

Examples of the measurement conditions include a measurement frequency of 0.1 Hz to 20 Hz (0.1 Hz, 0.2 Hz, 0.5 Hz, 1 Hz, 2 Hz, 5 Hz, 10 Hz, and 20 Hz), a measurement temperature of −50° C. to 150° C., a temperature rising rate of 2° C./min (in a nitrogen atmosphere), a sample size of 40 mm×10 mm (including the clamped region), and a chuck-to-chuck distance of 20 mm.

Further, the piezoelectric film 10 may further include an electrode lead-out portion that leads out the electrodes from the upper electrode 16 and the lower electrode 14, and an insulating layer which covers a region where the piezoelectric layer 12 is exposed for preventing a short circuit or the like, in addition to the piezoelectric layer, the electrode layer, and the protective layer.

The electrode lead-out portion may be an electrode lead-out portion configured such that a portion where the electrode layer and the protective layer project convexly outside the piezoelectric layer in the plane direction is provided or configured such that a part of the protective layer is removed to form a hole portion, and a conductive material such as silver paste is inserted into the hole portion so that the conductive material is electrically conducted with the electrode layer.

Further, the number of electrode lead-out portions is not limited to one, and each electrode layer may have two or more electrode lead-out portions. Particularly in a case of the configuration in which the electrode lead-out portion is obtained by removing a part of the protective layer and inserting a conductive material into the hole portion, it is preferable that the thin film electrode has three or more electrode lead-out portions in order to more reliably ensure the conduction.

Here, in the piezoelectric film 10 according to the embodiment of the present invention, the coefficient of variation of "intensity ratio $\alpha_1$ of (002) plane peak intensity and (200) plane peak intensity derived from piezoelectric particles= (002) plane peak intensity/((002) plane peak intensity+(200) plane peak intensity)" in a case where the polymer-based piezoelectric composite material which is the piezoelectric layer 12 is evaluated by the X-ray diffraction method is less than 0.3.

As described above, in the piezoelectric film using the polymer-based piezoelectric composite material formed by dispersing piezoelectric particles in a viscoelastic matrix as a piezoelectric layer, a ferroelectric material such as PZT is used as the piezoelectric particles. The crystal structure of the ferroelectric material is divided into a plurality of domains in which directions of spontaneous polarization are different from each other. In this state, since the spontaneous polarization of each domain and the piezoelectric effect produced by the spontaneous polarization cancel each other out, the piezoelectricity is not seen in the entire structure.

Therefore, in a piezoelectric film of the related art, the directions of spontaneous polarization of each domain are aligned by performing an electric polarization treatment such as corona poling to the piezoelectric layer and applying an electric field of a certain value or greater from the outside. The piezoelectric particles subjected to the electrical polarization treatment exhibit a piezoelectric effect in response to the electric field from the outside. In this manner, the piezoelectric film stretches and contracts in the plane direction and vibrates in a direction perpendicular to the plane in response to the applied voltage so that the polymer-based piezoelectric composite material film converts the vibration (sound) to an electric signal.

Meanwhile, the directions of spontaneous polarization of each domain of the crystal structure of the ferroelectric material (hereinafter, also simply referred to as the directions of the domains) are oriented in various directions such as the plane direction as well as the thickness direction of the piezoelectric film. Therefore, for example, even in a case where the electric polarization treatment is performed by applying a higher voltage, it is not possible to direct all the directions of the domains oriented in the plane direction, to the thickness direction in which an electric field is applied. In other words, the 90° domain cannot be completely removed.

Therefore, in the piezoelectric film of the related art, the directions of the domains are oriented in various directions, and thus a variation in aligning properties of the domains is significant. In the piezoelectric film formed of a piezoelectric layer in which the variation in aligning properties of the domains is significant, higher piezoelectricity cannot be obtained.

In general, the X-ray diffraction method (XRD) has been used as a method of analyzing the crystal structure of such a piezoelectric layer (piezoelectric particles), and XRD is used to investigate how the atoms are arranged inside a crystal.

Here, the (002) plane peak intensity is a tetragonal peak around 43.5° in an XRD pattern obtained by XRD analysis, and the (200) plane peak intensity is a tetragonal peak around 45° in the XRD pattern obtained by XRD analysis.

The XRD analysis can be performed using an X-ray diffractometer (SmartLab, manufactured by Rigaku Corporation) or the like.

Further, the (002) plane peak intensity corresponds to the proportion of the domains (c domains) of the piezoelectric film in the thickness direction, and the (200) plane peak intensity corresponds to the proportion of the domains (a domains) in the plane direction of the piezoelectric film.

Meanwhile, in the piezoelectric film according to the embodiment of the present invention, the coefficient of variation of the intensity ratio $\alpha_1$ of the (002) plane peak intensity and the (200) plane peak intensity derived from piezoelectric particles in a case where the polymer-based piezoelectric composite material which is the piezoelectric layer 12 is evaluated by the X-ray diffraction method is less than 0.3. That is, the variation in aligning properties of domains is small. In the piezoelectric film formed of a piezoelectric layer in which the variation in the aligning properties of domains is small and the orientations of the domains are arranged, higher piezoelectricity can be obtained.

Therefore, the piezoelectric film according to the embodiment of the present invention can increase, for example, the conversion efficiency between vibration (sound) and an electric signal, and a sound with a sufficient volume can be reproduced in a case where the piezoelectric film is used as a vibration plate of a speaker. Further, the conversion efficiency is high, and thus the power consumption can be reduced.

Here, the coefficient of variation of the intensity ratio $\alpha_1$ may be calculated by measuring optional five points of the intensity ratios $\alpha_1$ with an interval of 10 mm or greater in the plane direction (direction perpendicular to the thickness direction) of the piezoelectric layer according to the above-described X-ray diffraction method (XRD), calculating the average value and the standard deviation thereof, and dividing the standard deviation by the average value.

Further, from the viewpoint of further increasing the conversion efficiency, the intensity ratio $\alpha_1$ of the (002) plane peak intensity and the (200) plane peak intensity derived from piezoelectric particles in a case where the polymer-based piezoelectric composite material is evaluated by the X-ray diffraction method is preferably 0.6 or greater and less than 1 and more preferably in a range of 0.67 to 0.75.

That is, as the intensity ratio $\alpha_1$ increases (the ratio of the (002) plane peak intensity increases), the proportion of the domains (c domains) in the thickness direction of the piezoelectric film increases, and thus higher piezoelectricity can be obtained.

Further, in a case where the proportion of the domains (a domains) in the plane direction is large, 90° domain walls move in a case of application of a driving voltage, which causes distortion hysteresis, and as a result, distortion may occur in a sound to be reproduced.

On the contrary, 90° domain motion in the case of application of a driving voltage is reduced by reducing the proportion of the domains (a domains) in the plane direction, and thus distortion in a sound to be reproduced is reduced.

Further, some domains (a domains) oriented in the plane direction rotate so as to be oriented in the thickness direction (direction in which a driving voltage is applied) in the case of application of a driving voltage. Since such 90° domain motion is powerful, the piezoelectricity is further enhanced in a case where this effect is exhibited, and the piezoelectricity is further enhanced than a case where all domains are oriented in the thickness direction.

Therefore, the piezoelectricity can be further enhanced by setting the intensity ratio $\alpha_1$ to 0.75 or less and allowing the domains (a domains) oriented in the plane direction to remain at a certain ratio.

Next, an example of the method of producing the piezoelectric film 10 will be described with reference to FIGS. 2 to 4.

Figure 2:
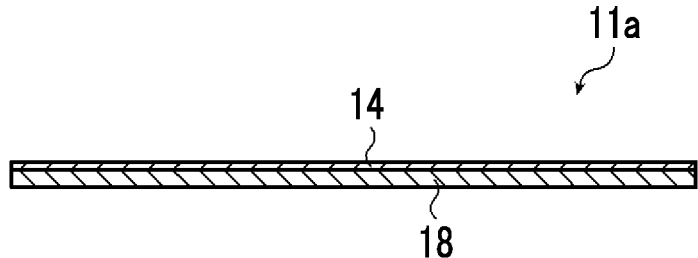
FIG. 2 is a conceptual view for describing an example of a method of preparing a polymer-based piezoelectric composite material film.
Figure 3:
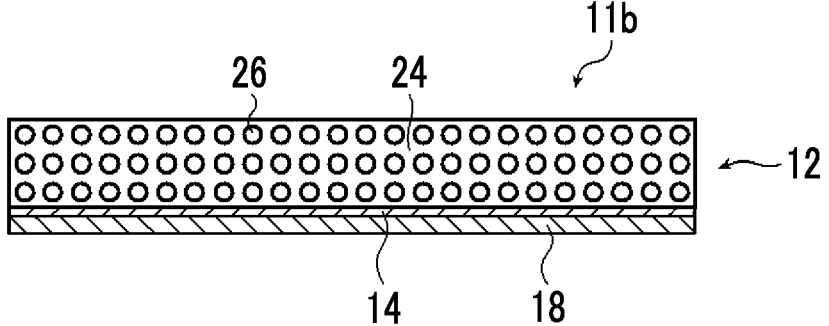
FIG. 3 is a conceptual view for describing an example of a method of preparing a polymer-based piezoelectric composite material film.

First, as illustrated in FIG. 2, a lower electrode laminate 11a in which the lower electrode 14 is formed on the lower protective layer 18 is prepared. The lower electrode laminate 11a may be prepared by forming a copper thin film or the like as the lower electrode 14 on the surface of the lower protective layer 18 using vacuum vapor deposition, sputtering, plating, or the like.

In a case where the lower protective layer 18 is extremely thin and thus the handleability is degraded, the lower protective layer 18 with a separator, (temporary support) may be used as necessary. Further, a PET having a thickness of 25 μm to 100 μm or the like can be used as the separator. The separator may be removed after thermal compression bonding of the upper electrode 16 and the upper protective layer 20 and before lamination of any member on the lower protective layer 18.

Meanwhile, a paint is prepared by dissolving a polymer material serving as a material of the matrix in an organic solvent, adding the piezoelectric particles 26 such as PZT particles thereto, and stirring the solution for dispersion.

The organic solvent other than the above-described substances is not limited, and various organic solvents can be used.

In a case where the lower electrode laminate 11a is prepared and the paint is prepared, the paint is cast (applied) onto the lower electrode laminate 11a, and the organic solvent is evaporated and dried. In this manner, as illustrated in FIG. 3, a first laminate 11b in which the lower electrode 14 is provided on the lower protective layer 18 and the piezoelectric layer 12 is formed on the lower electrode 14 is prepared. Further, the lower electrode 14 indicates an electrode on the base material side in a case where the piezoelectric layer 12 is applied, and does not indicate the vertical positional relationship in the laminate.

A casting method of the paint is not limited, and all known methods (coating devices) such as a slide coater or a doctor knife can be used.

As described above, in the piezoelectric film 10, in addition to the viscoelastic material such as cyanoethylated PVA, a dielectric polymer material may be added to the matrix 24.

In a case where the polymer material is added to the matrix 24, the polymer material added to the paint may be dissolved.

In addition, an upper electrode laminate 11c in which the upper electrode 16 is formed on the upper protective layer 20 is prepared. The upper electrode laminate 11c may be prepared by forming a copper thin film or the like as the upper electrode 16 on the surface of the upper protective layer 20 using vacuum vapor deposition, sputtering, plating, or the like.

Figure 4:
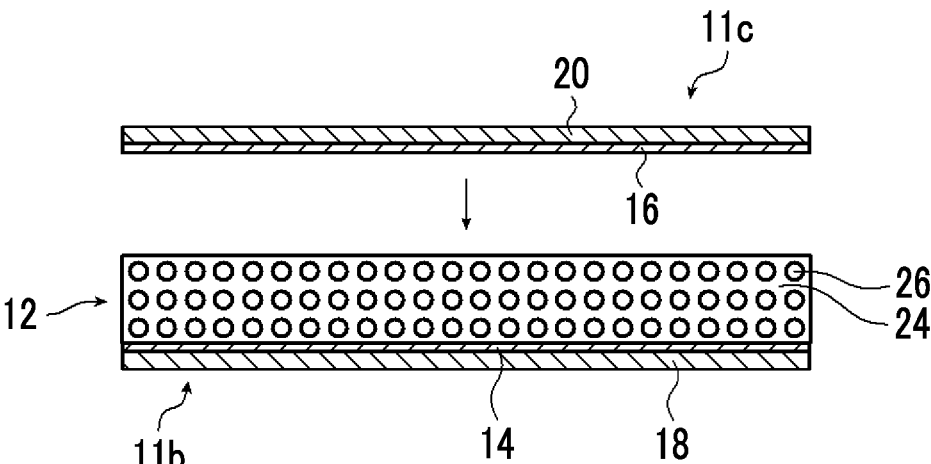
FIG. 4 is a conceptual view for describing an example of a method of preparing a polymer-based piezoelectric composite material film.

After preparation of a first laminate 101b formed such that the lower electrode 14 is provided on the lower protective layer 18 and the piezoelectric layer 12 is formed on the lower electrode 14, the upper electrode laminate 11c is laminated on the first laminate 11b such that the upper electrode 16 is oriented to the piezoelectric layer 12 as illustrated in FIG. 4.

Further, a laminate of the first laminate 11b and the upper electrode laminate 11c is subjected to the thermal compression bonding using a heating press device, a heating roller pair, or the like such that the upper protective layer 20 and the lower protective layer 18 are sandwiched.

The piezoelectric layer 12 is subjected to an electrical polarization treatment (poling) after preparation of the laminate of the first laminate 11b and the upper electrode laminate 11c.

A method of performing the electrical polarization treatment on the piezoelectric layer 12 is not limited, and a known method can be used.

Before the electrical polarization treatment, a calender treatment may be performed to smoothen the surface of the piezoelectric layer 12 using a heating roller or the like. By performing the calender treatment, a thermal compression bonding step described below can be smoothly performed.

Further, the configuration in which the electrical polarization treatment is performed after the lamination of the upper electrode laminate 11c on the first laminate 11b is not limited, and the electrical polarization treatment may be performed before lamination of the upper electrode laminate 11c.

The domains (180° domains) oriented in a direction opposite to the thickness direction which is the direction in which the electric field is applied are switched by the electrical polarization treatment, that is, 180° domain motion is caused so that the directions of domains in the thickness direction can be aligned.

A polymer-based piezoelectric composite material film in which the electrode layers and the protective layers are laminated on both surfaces of the piezoelectric layer 12 is prepared by performing the above-described steps. The prepared polymer-based piezoelectric composite material film may be cut into a desired shape according to various applications.

Such a polymer-based piezoelectric composite material film may be produced by using a cut sheet-like material or may be prepared by roll to roll (hereinafter, also referred to as RtoR).

Here, in the method of producing such a polymer-based piezoelectric composite material film in the present invention, it is preferable that at least one of the following treatments 1 to 3 is performed in order to prepare a piezoelectric film in which the coefficient of variation of the intensity ratio $\alpha_1$ is less than 0.3.

(Treatment 1)

The treatment 1 is a treatment of performing a polarization treatment by heating the piezoelectric layer 12 in a case of performing the electrical polarization treatment on the piezoelectric layer 12 so that the coefficient of variation of the temperature of the piezoelectric layer 12 during the polarization treatment is set to less than 0.5.

In a case where the temperature of the piezoelectric layer is low in the electrical polarization treatment, the temperature moves away from the Curie point, and thus polarization is unlikely to occur. Therefore, it is preferable that the polarization treatment is performed by heating the piezoelectric layer in a case of performing the polarization treatment from the viewpoint of promoting polarization.

Here, in a case where the temperature of the piezoelectric layer during the electrical polarization treatment is non-uniform in the plane direction and the temperature varies, there is a concern that variation in polarization may occur depending on the position of the piezoelectric layer in the plane direction and this may result in non-uniform polarization. Examples of the method of heating the piezoelectric layer in a case of the electrical polarization treatment include a method of using a hot plate, a method of using hot air, and a method of using infrared rays. However, in general, in a case where the piezoelectric layer is heated by any of these methods, the temperature is likely to be non-uniform depending on the position.

On the contrary, it is possible to suppress the non-uniformity of polarization by setting the temperature of the piezoelectric layer to be uniform during the electrical polarization treatment. In this manner, the coefficient of variation of the intensity ratio $\alpha_1$ can be set to less than 0.3.

The temperature of the piezoelectric layer during the electrical polarization treatment is preferably in a range of 20° C. to 130° C., more preferably in a range of 50° C. to 100° C., and still more preferably in a range of 80° C. to 100° C. The temperature of the piezoelectric layer during the electrical polarization treatment may be estimated indirectly by measuring the surface temperature of the electrode layer or the protective layer using a contact thermometer.

Further, the coefficient of variation of the temperature of the piezoelectric layer 12 may be calculated by measuring optional five points of temperatures of the piezoelectric layer with an interval of 10 mm or greater, calculating the average value and the standard deviation thereof, and dividing the standard deviation by the average value.

(Treatment 2)

The treatment 2 is a treatment of applying a pressure to the piezoelectric layer 12 in a case where the electrical polarization treatment is performed on the piezoelectric layer 12.

In a case where a pressure is applied to the piezoelectric layer 12, asymmetry in an electric charge occurs, and thus domains are likely to be aligned by the electric field. Therefore, the domains are likely to be aligned by applying the pressure to the piezoelectric layer 12 to perform the electrical polarization treatment, and the coefficient of variation of the intensity ratio $\alpha_1$ can be set to less than 0.3.

As a method of applying the pressure to the piezoelectric layer 12 during the electrical polarization treatment, the pressure may be applied to the piezoelectric layer 12 by pressing the laminate of the first laminate 11b and the upper electrode laminate 11c from each side of the upper protective layer 20 and the lower protective layer 18. Further, in a case where the polarization treatment is performed on the first laminate 11b, the pressure may be applied to the piezoelectric layer 12 by pressing the laminate from each side of the piezoelectric layer 12 and the lower protective layer 18.

The pressure applied to the piezoelectric layer 12 is preferably in a range of 0.3 MPa to 0.9 MPa, more preferably in a range of 0.5 MPa to 0.9 MPa, and still more preferably in a range of 0.6 MPa to 0.8 MPa.

It is preferable that the pressure is uniformly applied to the piezoelectric layer 12 in the plane direction.

(Treatment 3)

The treatment 3 is a treatment of setting the amplitude of wrinkles formed on the piezoelectric film to be in a range of 1 μm to 20 μm.

In the method of producing the piezoelectric film, wrinkles may be generated on the piezoelectric film (laminate) in the step of laminating the upper electrode laminate 11c on the first laminate 11b. The wrinkles may be generated due to a difference in the Young's modulus and the degree of thermal expansion between layers. The stress is concentrated on the wrinkles in a case where wrinkles are generated on the piezoelectric film. In the portion where the stress is concentrated, depolarization occurs and the aligning properties are degraded.

On the contrary, it is possible to suppress the stress from being locally concentrated on the piezoelectric film and to suppress the occurrence of depolarization by setting the amplitude of the wrinkles formed on the piezoelectric film to be in a range of 1 μm to 20 μm. In this manner, the coefficient of variation of the intensity ratio $\alpha_1$ can be set to less than 0.3.

Examples of the method of setting the amplitude of the wrinkles formed on the piezoelectric film to be in a range of 1 μm to 20 μm include a method of applying a tension to the first laminate 11b and the upper electrode laminate 11c and laminating the first laminate 11b and the upper electrode laminate 11c while generation of wrinkles is suppressed, in the step of laminating the upper electrode laminate 11c on the first laminate 11b.

As the tension to be applied to the first laminate 11b and the upper electrode laminate 11c, the tension at which generation of wrinkles can be suppressed without damaging the first laminate 11b and the upper electrode laminate 11c may be appropriately set depending on the thickness, the material, and the like of the first laminate 11b and the upper electrode laminate 11c.

From the viewpoint of further decreasing the coefficient of variation of the intensity ratio $\alpha_1$, the amplitude of wrinkles formed on the piezoelectric film is preferably in a range of 1 μm to 20 μm and more preferably in a range of 1 μm to 10 μm.

The amplitude of the wrinkles formed on the piezoelectric film is measured as follows.

First, the piezoelectric film is cut into a size of 20 mm in the longitudinal direction and 200 mm in the width direction (direction orthogonal to the longitudinal direction) with scissors or the like. Next, the cut piezoelectric film is placed on an XY stage, and the film is fixed at a pressure of 0.6 g/cm$^2$ by placing weights on regions of 5 mm at both end portions in the width direction. After the fixation of the piezoelectric film, the surface of the piezoelectric film is scanned with a laser displacement meter (measurement range: 100 μm) in an optional direction and in a direction orthogonal to this optional direction at a speed of 40 mm/s and the amplitude of wrinkles on the surface of the piezo-electric film is measured. The larger value between the measured values in the two directions is defined as the amplitude of wrinkles formed on the piezoelectric film.

Such measurement is carried out at optional three points with an interval of 5 mm or greater, and the average value of the amplitudes of wrinkles is acquired.

Further, for example, an XY stage BS-2020SG (manu-factured by COMS Co., Ltd.) can be used as the XY stage. Further, for example, a laser displacement meter LT-9030M (manufactured by KEYENCE Corporation) can be used as the laser displacement meter.

Further, from the viewpoint of decreasing the amplitude of wrinkles formed on the piezoelectric film, it is preferable that the piezoelectric film is hard. Meanwhile, in a case where the piezoelectric film is extremely hard, there is a concern that the piezoelectric film is less likely to vibrate, and thus the conversion efficiency is decreased. From this viewpoint, the Young's modulus of the piezoelectric film is preferably in a range of 0.5 GPa to 3.5 GPa, more preferably in a range of 0.5 GPa to 2.0 GPa, and still more preferably in a range of 0.8 GPa to 1.5 GPa.

Further, in the method of producing a polymer-based piezoelectric composite material film in which the polymer-based piezoelectric composite material film according to the embodiment of the present invention is prepared, a step of performing a mechanical polarization treatment may be performed.

Specifically, the mechanical polarization treatment is a step of applying a shearing stress to the piezoelectric layer 12 of the second laminate 11d in which the upper electrode laminate 11c is laminated on the first laminate 11b. By applying the shearing stress to the piezoelectric layer 12, the proportion of the a domains oriented in the plane direction can be decreased, and the proportion of the c domains oriented in the thickness direction can be increased. That is, the intensity ratio $\alpha_1$ in the piezoelectric layer can be increased by performing the mechanical polarization treat-ment.

The reason why the proportion of the c domains is increased by applying the shearing stress to the piezoelectric layer 12 is assumed as follows.

In a case where the shearing stress is applied to the piezoelectric layer 12 (piezoelectric particles 26), since the piezoelectric particles 26 extend in the vertical direction (thickness direction), 90° domain motion occurs during the extension, and the a domains oriented in the plane direction are set as the c domains oriented in the thickness direction. In addition, the orientation of the c domains oriented in the thickness direction does not change. As a result, it is assumed that the proportion of a domains decreases and the proportion of c domain increases.

As described above, the intensity ratio $\alpha_1$ of the (002) plane peak intensity and the (200) plane peak intensity derived from piezoelectric particles in a case where the piezoelectric layer 12 is evaluated by the X-ray diffraction method can be set to 0.6 or greater by performing the mechanical polarization treatment and increasing the pro-portion of the c domains by decreasing the proportion of the a domains, and thus higher piezoelectricity can be obtained.

Here, in the present invention, the mechanical polariza-tion treatment is performed after the electrical polarization treatment.

The 90° domain motion occurring due to the mechanical polarization treatment is likely to occur in a case where the 180° domain walls are eliminated.

Therefore, 90° domain motion occurs, the a domains oriented in the plane direction are allowed to be oriented in the thickness direction and set as the c domains, and thus the proportion of the c domains can be increased by performing the mechanical polarization treatment after a state in which 180° domain motion occurs due to the electrical polarization treatment, 180° domain walls are eliminated, and thus 90° domain motion is likely to occur is prepared.

Figure 5:
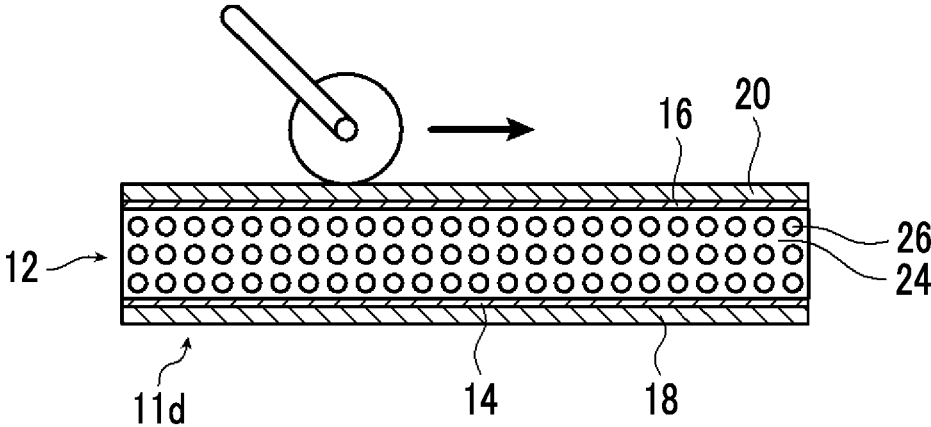
FIG. 5 is a conceptual view for describing an example of a method of preparing a polymer-based piezoelectric composite material film.

Examples of the method of applying the shearing stress to the piezoelectric layer 12 as the mechanical polarization treatment include a method of pressing a roller from a side of one surface of the second laminate 11d as illustrated in FIG. 5.

The kind of roller in a case where the shearing stress is applied to the piezoelectric layer 12 using a roller is not particularly limited, and a rubber roller, a metal roller, or the like can be appropriately used.

Further, the value of the shearing stress applied to the piezoelectric layer 12 is not particularly limited, and may be appropriately set according to the performance required for the piezoelectric film, the material and thickness of each layer of the piezoelectric film, and the like.

The shearing stress applied to the piezoelectric layer 12 may be acquired by dividing the applied shearing load by the cross-sectional area parallel to the shearing load or may be acquired by detecting the tensile strain or the compressive strain generated by the tensile stress or the compressive stress and calculating the shearing stress based on the detection result.

Further, in a case where the shearing stress is applied to the piezoelectric layer 12 using a roller, the temperature of the piezoelectric film and the roller is set to be preferably in a range of 20° C. to 130° C. and more preferably in a range of 50° C. to 100° C. Since the polymer material is extremely soft and thus the shearing force is unlikely to be applied in a case where the temperature is extremely high, and the polymer material is extremely hard and thus the proportion of domains is unlikely to be changed in a case where the temperature is low, the proportion of domains is considered to be easily changed by holding the temperature at which the polymer material is moderately soft.

As an example, the piezoelectric film according to the embodiment of the present invention is used in various acoustic devices (audio equipment) such as speakers, micro-phones, and pickups used in musical instruments such as guitars, to generate (reproduce) a sound from the vibration in response to an electric signal or convert the vibration from a sound into an electric signal.

Further, the piezoelectric film can also be used in pressure sensitive sensors, power generation elements, and the like in addition to the examples described above.

Further, for example, in a case where the piezoelectric film is used for a speaker, the piezoelectric film may be used as a speaker that generates a sound from the vibration of the film-like piezoelectric film. Alternatively, the piezoelectric film may be used as an exciter that generates a sound by being attached to a vibration plate to vibrate the vibration plate, from the vibration of the piezoelectric film.

Hereinbefore, the polymer-based piezoelectric composite material film according to the embodiment of the present invention has been described in detail, but the present invention is not limited to the above-described examples, and various improvements or modifications may be made within a range not departing from the scope of the present invention.

EXAMPLES

Hereinafter, the present invention will be described in more detail with reference to specific examples of the present invention. Further, the present invention is not limited to the examples, and the materials, the used amounts, the proportions, the treatment contents, the treatment procedures, and the like shown in the following examples can be appropriately changed within a range not departing from the scope of the present invention.

Example 1

(Preparation Step)

Further, the lower electrode laminate 11a and the upper electrode laminate 11c formed by vacuum-depositing a copper thin film with a thickness of 0.1 μm on a PET film having a thickness of 4 μm were prepared. That is, in the present example, the upper electrode 16 and the lower electrode 14 are copper-deposited thin films having a thickness of 0.1 m, and the upper protective layer 20 and the lower protective layer 18 are PET films having a thickness of 4 μm.

In order to obtain satisfactory handleability during the process, a film with a separator (temporary support PET) having a thickness of 50 μm was used as the PET film, and the separator of each protective layer was removed after the thermal compression bonding of the upper electrode laminate 11c.

(First Lamination Step)

First, cyanoethylated PVA (CR-V, manufactured by Shin-Etsu Chemical Co., Ltd.) was dissolved in methyl ethyl ketone (MEK) at the following compositional ratio. Thereafter, PZT particles were added to the solution at the following compositional ratio and dispersed using a propeller mixer (rotation speed of 2000 rpm), thereby preparing a paint for forming the piezoelectric layer 12.

PZT Particles: 300 parts by mass
Cyanoethylated PVA: 15 parts by mass
MEK: 85 parts by mass In addition, PZT particles obtained by sintering commercially available PZT raw material powder at 1000° C. to 1200° C. and crushing and classifying the sintered powder to have an average particle diameter of 5 μm were used as the PZT particles.

The lower electrode 14 (copper-deposited thin film) of the lower electrode laminate 11a prepared in advance was coated with a paint for forming the piezoelectric layer 12 prepared in advance using a slide coater. Further, the paint was applied such that the film thickness of the coating film after being dried reached 20 μm.

Next, a material obtained by coating the lower electrode laminate 11a with the paint was heated and dried on a hot plate at 120° C. to evaporate MEK.

(Second Lamination Step)

The upper electrode laminate 11c was laminated on the first laminate 11b such that the side of the upper electrode 16 (side of the copper thin film) was oriented to the piezoelectric layer 12, and the laminate was subjected to thermal compression bonding at 120° C. Here, a tension of 5 N/mm$^2$ was applied to each of the first laminate 11b and the upper electrode laminate 11c (treatment 3).

In this manner, the piezoelectric layer 12 and the upper electrode 16 and the lower electrode 14 were adhered to each other, thereby preparing the second laminate 11d.

(Electrical Polarization Treatment Step)

The electrical polarization treatment was performed on the piezoelectric layer 12 by applying a voltage to a space between the lower electrode 14 and the upper electrode 16 of the second laminate 11d. The electrical polarization treatment was performed by placing the second laminate 12d on a hot plate, setting the temperature of the piezoelectric layer 12 to 100° C., and applying a DC voltage of 6 kV to a space between the lower electrode 14 and the upper electrode 16.

Here, the fluctuation of the temperature of the piezoelectric layer 12 was suppressed and the temperature distribution was made uniform by placing the piezoelectric layer after the hot plate was sufficiently heated and covering the piezoelectric layer with a metal flat plate (treatment 1). The coefficient of variation of the temperature of the piezoelectric layer 12 was 0.02.

Further, the electrical polarization treatment was performed while the second laminate 11d was uniformly pressed from the side of the lower protective layer 18 and the upper protective layer 20 side and a pressure was applied to the piezoelectric layer 12 during the electrical polarization treatment (treatment 2). The pressure applied to the piezoelectric layer 12 was 0.7 MPa.

As described above, the polymer-based piezoelectric composite material film was prepared.

<Measurement of Intensity Ratio>

The XRD pattern of the crystal structure of the piezoelectric particles 26 in the piezoelectric layer 12 of the prepared piezoelectric film was measured by the X-ray diffraction method (XRD) using an X-ray diffractometer (SmartLab Cu radiation source, manufactured by Rigaku Corporation, 45 kV, 200 mA). The sample was fixed on an adsorption sample table, and the measurement was performed by setting the incidence angle with respect to the sample surface to 0.5°.

The above-described measurement was performed after the electrodes were peeled off from the piezoelectric film as follows before the measurement.

First, the piezoelectric film was cut into a size of 40 mm with scissors or the like. Further, 1.5 mol/L of an iron chloride aqueous solution obtained by mixing a ferric chloride hexahydrate and pure water was prepared. The cut piezoelectric film was immersed while being hung in the prepared iron chloride aqueous solution for 12 hours. Thereafter, the immersed piezoelectric film was taken out and washed with pure water several times. The corners of the washed piezoelectric film were held, and the upper electrode laminate was peeled off from the piezoelectric layer at a speed of approximately 4 mm/s to expose the piezoelectric layer. The piezoelectric film from which the upper electrode laminate had been peeled off was washed with pure water several times and naturally dried for 24 hours. In this manner, the electrodes were peeled off from the piezoelectric film, and the XRD measurement was performed on the piezoelectric layer.

The intensity ratio "$\alpha_1$ of (002) plane peak intensity and (200) plane peak intensity derived from piezoelectric particles=(002) plane peak intensity/((002) plane peak intensity+(200) plane peak intensity)" was acquired by reading the (002) plane peak intensity around 43.5° and the (200) plane peak intensity around 45° based on the measured XRD pattern.

Such a measurement was performed by measuring optional five points of the intensity ratios and the coefficient of variation was calculated from the average value and the standard deviation of the five points of the intensity ratios $\alpha_1$.

The coefficient of variation of the intensity ratio $\alpha_1$ was 0.09. The intensity ratio $\alpha_1$ (average value) was 0.80.

Further, the Young's modulus of the prepared piezoelectric film was 1.2 GPa.

Examples 2 to 8 and Comparative Example 1

The polymer-based piezoelectric composite material film 10 was prepared in the same manner as in Example 1 except that the presence of the treatment 3 in the second lamination step and the presence of the treatment 1 and the treatment 2 in the electrical polarization treatment step were changed as listed in Table 1.

Further, the XRD pattern of each of the prepared piezoelectric films was measured in the same manner as in Example 1, and the coefficient of variation of the intensity ratio $\alpha_1$ and the intensity ratio $\alpha_1$ (average value) were acquired.

Comparative Example 2

A polymer-based piezoelectric composite material film was prepared in the same manner as in Example 7 except that the lower electrode laminate 11a and the upper electrode laminate 11c formed by vacuum-depositing a copper thin film with a thickness of 0.1 μm on a polypropylene film having a thickness of 4 μm were prepared.

Further, the XRD pattern of each of the prepared piezoelectric films was measured in the same manner as in Example 1, and the coefficient of variation of the intensity ratio $\alpha_1$ and the intensity ratio $\alpha_1$ (average value) were acquired.

Comparative Example 3

A polymer-based piezoelectric composite material film was prepared in the same manner as in Comparative Example 1 except that the lower electrode laminate 11a and the upper electrode laminate 11c formed by vacuum-depositing a copper thin film with a thickness of 0.1 μm on a polyaramid film having a thickness of 4 μm were prepared.

Further, the XRD pattern of each of the prepared piezoelectric films was measured in the same manner as in Example 1, and the coefficient of variation of the intensity ratio $\alpha_1$ and the intensity ratio $\alpha_1$ (average value) were acquired.

<Young's Modulus>

The method of measuring the Young's modulus of the piezoelectric film is described below.

A tensile tester (for example, RTF-1310, manufactured by A & D Company, Limited.) was used.

A measurement sample having a length of 80 mm and a width of 12.8 mm (including a holding part) was cut out from the piezoelectric film with a cutter (craft cutter, product number: XB141, manufactured by OLFA).

The top and bottom of the measurement sample were fixed. The distance between gripping jigs was set to 50 mm.

After the measurement sample was chucked, a stress was gradually applied to the measurement sample in the direction in which the measurement sample is pulled. The pulling speed was set to 10 mm/min. The temperature of the measuring room was set to 25° C. and the humidity thereof was set to 55%. The Young's modulus was calculated by the following equation based on the change in stress and the amount of elongation during the measurement.

$$E=(\Delta N/S)/(\Delta x/L)\times 10^{-3}$$

$\Delta N$: change in stress (N), S: cross-sectional area of test piece (mm$^2$), $\Delta x$: amount of elongation (mm), and L: distance between gripping jigs (mm)

The stress range was set to be in a range of 0.3N to 5.0N and used for the calculation of the change in stress ($\Delta N$) and the amount of elongation ($\Delta x$) at this time.

[Evaluation]

<Sound Pressure Sensitivity>

(Preparation of Electroacoustic Converter)

A sheet in which a 30 μm silicon oxide film was vapor-deposited on both surfaces of a PET film having a thickness of 200 μm was cut into an A4 size and prepared as a vibration plate.

The prepared electroacoustic conversion film was cut into a size of 5 cm×10 cm, double-sided tape having a thickness of 10 μm was attached to the entire one surface side, and the film was attached to the central portion of an A4-sized vibration plate. Next, both short sides of the A4-sized vibration plate were fixed to a plastic rod to prepare an electroacoustic converter.

Further, in a case where the conversion film was taken out from the electroacoustic converter, the vibration plate may be scraped off to take out the electroacoustic conversion film in the following manner.

In order to scrape off the vibration plate from the electroacoustic converter, the thickness of only the vibration plate portion in the surface of the electroacoustic converter was first measured by MINICOM (manufactured by Tokyo Semitsu Co., Ltd.). The measurement position in the plane was evenly divided into 10 sections such that the area of only the vibration plate portion was identical within a range of ±10% on average, the thickness was measured at random positions by n=5 times in each section, and the thicknesses of 50 points of "10 sections×n=5" were averaged, thereby acquiring the representative thickness of the vibration plate. Next, the thickness of the electroacoustic converter at the portion to which the electroacoustic conversion film was attached was measured (n=5 points) at intervals of 5 mm or greater, and the average thickness of the electroacoustic converter was acquired.

Next, the electroacoustic converter was fixed onto the milling machine using a FIX FILM (manufactured by Fujicopian Co., Ltd.). Next, the vibration plate was cut with a milling machine, and the electroacoustic conversion film from which the vibration plate was removed was taken out. The confirmation of whether the vibration plate was removed from the electroacoustic converter and the electroacoustic conversion film was able to be taken out was carried out based on whether the thickness of the layer including the electroacoustic conversion film remaining after the milling was in a range of ("thickness of electroacoustic converter acquired above"–"thickness of vibration plate acquired above")±5 μm. The thickness of the layer including the remaining electroacoustic conversion film was measured (n=5 points) at in-plane intervals of 5 mm or longer to obtain an average thickness. In a case where the thickness of the electroacoustic conversion film here is in the range defined above, a trace amount of residues of the vibration plate and the double-sided tape for adhering the vibration plate and the electroacoustic conversion film may remain.

(Measurement of Sound Pressure)

The level of the sound pressure of the prepared electroacoustic converter was measured, and the sound pressure sensitivity was acquired.

Specifically, the level of the sound pressure was measured and converted into the sound pressure sensitivity by disposing a microphone P at a position separated from the center of the piezoelectric film of the electroacoustic converter by 0.5 m and inputting a 1 W sine wave with a frequency of 1 kHz to a space between the upper electrode and the lower electrode of the electroacoustic converter.

The evaluation results are listed in Table 1.

Further, in Comparative Example 2, it was found that in a case where the Young's modulus of the piezoelectric film is small, wrinkles are likely to occur even in a case where the treatment 3 (application of the tension) is performed, and thus the sound pressure sensitivity is decreased.

As shown in the results described above, the effects of the present invention are apparent.

EXPLANATION OF REFERENCES

10: polymer-based piezoelectric composite material film
11a: lower electrode laminate
11b: first laminate
11c: upper electrode laminate
11d: second laminate
12: piezoelectric layer
14: lower electrode
16: upper electrode
18: lower protective layer
20: upper protective layer
24: viscoelastic matrix
26: piezoelectric particle

What is claimed is:

1. A polymer-based piezoelectric composite material film comprising:

TABLE 1

| | Production method | | | Piezoelectric film | | | | Evaluation |
| | | | | Intensity ratio | | Amplitude | Young's | Sound pressure |
| | Treatment 1 | Treatment 2 | Treatment 3 | Coefficient of variation | Average value | of wrinkles μm | modulus GPa | sensitivity dB/(Wm) |
| --- | --- | --- | --- | --- | --- | --- | --- | --- |
| Example 1 | Performed | Performed | Performed | 0.09 | 0.80 | 2.7 | 1.2 | 88.4 |
| Example 2 | Performed | Performed | Not performed | 0.12 | 0.73 | 22.7 | 1.2 | 84.0 |
| Example 3 | Performed | Not performed | Performed | 0.08 | 0.77 | 5.1 | 1.2 | 86.1 |
| Example 4 | Not performed | Performed | Performed | 0.13 | 0.76 | 4.2 | 1.2 | 85.5 |
| Example 5 | Performed | Not performed | Not performed | 0.2 | 0.61 | 29.5 | 1.2 | 78.6 |
| Example 6 | Not performed | Performed | Not performed | 0.22 | 0.61 | 24.3 | 1.2 | 79.0 |
| Example 7 | Not performed | Not performed | Performed | 0.15 | 0.63 | 3.7 | 1.2 | 79.2 |
| Example 8 | Not performed | Not performed | Performed | 0.24 | 0.57 | 15.0 | 1.2 | 73.1 |
| Comparative Example 1 | Not performed | Not performed | Not performed | 0.45 | 0.50 | 28.3 | 1.2 | 69.7 |
| Comparative Example 2 | Not performed | Not performed | Performed | 0.35 | 0.53 | 33.3 | 0.4 | 71.9 |
| Comparative Example 3 | Not performed | Not performed | Not performed | 0.31 | 0.55 | 3.6 | 3.6 | 66.4 |

As listed in Table 1, it was found that the sound pressure sensitivity was improved in Examples 1 to 8 of the polymer-based piezoelectric composite material film of the present invention, as compared with Comparative Examples 1 to 3.

Based on the comparison of the examples, it was found that the sound pressure sensitivity is improved as the coefficient of variation of the intensity ratio $\alpha_I$ decreases and the average value increases.

Further, based on the comparison between Examples 3 and 4, the comparison between Examples 5 to 7, and the like, it was found that the amplitude of the wrinkles formed on the piezoelectric film is preferably 20 μm or less.

a polymer-based piezoelectric composite material which contains piezoelectric particles in a matrix containing a polymer material; and two electrode layers which are laminated on both surfaces of the polymer-based piezoelectric composite material, wherein an amplitude of wrinkles formed on the polymer-based piezoelectric composite material film is in a range of 1 μm to 20 μm, and a coefficient of variation of an intensity ratio $\alpha_I$ of (002) plane peak intensity and (200) plane peak intensity derived from the piezoelectric particles=(002) plane peak intensity/((002) plane peak intensity+(200) plane peak intensity) in a case where the polymer-based piezoelectric composite material is evaluated by an X-ray diffraction method is less than 0.3.

2. The polymer-based piezoelectric composite material film according to claim 1, wherein the intensity ratio $\alpha_t$ is 0.6 or greater and less than 1.

3. The polymer-based piezoelectric composite material film according to claim 1, wherein the polymer-based piezoelectric composite material film has a Young's modulus of 0.5 GPa to 3.5 GPa.

4. The polymer-based piezoelectric composite material film according to claim 2, wherein the polymer-based piezoelectric composite material film has a Young's modulus of 0.5 GPa to 3.5 GPa.

* * * * *